United States Patent [19]

Schena

[11] Patent Number: 5,831,538

[45] Date of Patent: Nov. 3, 1998

[54] ELECTRICAL FIRE HAZARD DETECTOR

[76] Inventor: Robert G. Schena, 19064 Pelican Cove Crt., South Bend, Ind. 46637-3900

[21] Appl. No.: 819,774

[22] Filed: Mar. 18, 1997

[51] Int. Cl.$^6$ .................................................. G08B 21/00
[52] U.S. Cl. ........................ 340/635; 340/539; 340/658; 324/536
[58] Field of Search ..................................... 340/635, 539, 340/658, 659, 661, 500; 324/536, 520

[56] References Cited

U.S. PATENT DOCUMENTS

| | | | |
|---|---|---|---|
| 3,257,653 | 6/1966 | McCorkindale | 340/539 |
| 3,559,194 | 1/1971 | Bisberg | 340/539 |
| 4,101,872 | 7/1978 | Pappas | 340/539 |
| 4,158,148 | 6/1979 | Teller, Jr. | 340/539 |
| 4,247,848 | 1/1981 | Kitta et al. | 340/539 |
| 4,638,304 | 1/1987 | Kimura et al. | 340/661 |
| 4,641,127 | 2/1987 | Hogan et al. | 340/539 |
| 4,731,586 | 3/1988 | Perkins | 324/536 |
| 4,814,748 | 3/1989 | Todd | 340/628 |
| 5,223,795 | 6/1993 | Blades | 324/536 |
| 5,373,241 | 12/1994 | Ham, Jr. et al. | 324/536 |
| 5,432,455 | 7/1995 | Blades | 324/536 |
| 5,434,509 | 7/1995 | Blades | 324/536 |
| 5,477,150 | 12/1995 | Ham, Jr. et al. | 324/536 |
| 5,633,623 | 5/1997 | Campman | 340/321 |

Primary Examiner—Jeffery A. Hofsass
Assistant Examiner—Anh La
Attorney, Agent, or Firm—Richard C. Litman

[57] ABSTRACT

An electrical fire hazard detector which senses an arcing condition in AC power distribution systems by sensing radio frequency radiation generated by arcing. The detector senses certain frequencies and duty cycle(s) present in a frequency selected, demodulated and pulse converted radio frequency signal and activates a visual and audible alarm. The detector is contained within a compact housing and includes: a power on LED; an electrical fire hazard detected LED; a CLEAR push-button; a TEST push-button; an audible alarm; and a range/sensitivity switch. The TEST push-button simulates a detected hazard for insuring proper operation of the detector. The CLEAR push-button resets the detector after a simulated or real detection of an electrical fire hazard. The range/sensitivity switch selects either a MINIMUM or MAXIMUM detection range by connection to an internal antenna, which may be a directional type antenna, or to the power distribution system respectively. The detector is a low cost device in that it contains a compact transformerless AC-DC power supply and only two standard integrated circuits, namely a PLL frequency detector and a quad comparator. The device can be powered either from a standard electrical outlet or from a battery. When the device is powered from a battery, the housing can be removed from its mounting location, and with the use of a directional or omnidirectional type antenna can be hand held to localize the source of the hazard.

20 Claims, 3 Drawing Sheets

ELECTRICAL FIRE HAZARD DETECTOR

BACKGROUND OF THE INVENTION

1. Field of the Invention

The present invention relates to a device that identifies electrical fire hazards by detecting electrical arcs occurring in an alternating current (AC) power electrical distribution system.

2. Description of the Prior Art

Devices for detecting arcs in AC power electrical systems are known in the prior art. Many of the prior art devices tend to be complicated, expensive, and in most cases require wiring modifications for installation.

U.S. Pat. No. 4,731,586, issued to Perkins, discloses an electrical noise detector which includes a radio receiver coupled to an antenna to detect broadband radio frequencies and produce demodulated pulses indicative of the noise. The pulses are then fed to a squelch circuit to block the pulses below a predetermined magnitude. A sample and hold circuit feeds the pulses to a notch filter for identifying frequencies associated with gap type noise. Specific circuit details are not disclosed.

U.S. Pat. Nos. 5,223,795, 5,432,455 and 5,434,509, issued to Blades, disclose methods and apparatus for detecting arcing in electrical connections by monitoring high frequency noise including audible and visual alarms and including testing and resetting functions. All of the devices disclosed by Blades require the use of a microprocessor, thus these circuits are relatively expensive.

U.S. Pat. Nos. 5,373,241 and 5,477,150, issued to Ham, Jr. et al., disclose electric arc detection devices that detect a spectrum of broad band instantaneous radio frequencies in radio frequency noise. Both of these patents teach systems that require an excessive number of components that lead to a rather costly device.

None of the above inventions and patents, taken either singly or in combination, is seen to describe the instant invention as claimed.

SUMMARY OF THE INVENTION

The present invention is an electrical fire hazard detector. Arcing in electrical wiring can create heat levels high enough for combustion to occur. By sensing the radio frequency radiation that is generated by the arcing, the device of the present invention can detect an arcing condition in an AC power distribution system. By using low cost analog and digital signal processing circuitry, the device performs hardware level signature analysis in a cost effective manner to distinguish true arcing conditions from numerous other sources of RF energy. The present invention uses only two integrated circuits, together with low cost discrete components to detect a fire hazard caused by arcing without undue wiring modifications on the AC power distribution system. The device uses a phase-locked loop, PLL circuit to detect certain frequency components (120 Hz and 60 Hz in 60 Hz power systems and 100 Hz and 50 Hz in 50 Hz power systems) with certain duty cycles (preferably 20–90%) present in an amplitude demodulated and pulse converted radio frequency signal. This signal is derived using an open loop saturated operation only amplifier, known as a comparator. When these frequencies are present for a predetermined period of time, preferably 0.5 seconds, and conform to the minimum and maximum duty cycle requirements, an "Electrical Fire Hazard Detected" visual and audible alarm is activated. Each time the hazard is detected an intermittent audible signal is enabled for a predetermined length of time, preferably three seconds, and a flashing visual indication is latched on until an operator clears the alarm. By sounding the audible alarm for each hazard detected, the operator is able to correlate the fire hazard condition to the operation of electrical loads and circuits in the system being monitored. Once a hazard has been detected, the audible alarm continues to sound for one second once every ten seconds, so that the unit does not have to be visually inspected to verify the alarm status.

This type of arcing detecting does not discriminate against load types, does not require power waveform synchronization and is extremely sensitive, accurate and immune to common household appliance noise. This noise can be generated by brush type DC motors, SCR controlled lamp dimmers, variable speed motor controllers, electronic fluorescent lighting, and carrier current communication systems. The electrical arcing can be detected regardless of whether the load is resistive, capacitive, inductive or varies during operation in the current to voltage phase relationship. Due to similarities between a true hazardous arc and a "false" arc (arcing or noise normally generated from various sources), the device of the present invention will generate an alarm in limited cases in response to certain RF radiation that is not generated from a hazardous arcing condition. Conversely, in limited cases the device of the present invention will not generate an alarm in response to some actual hazardous arcing. Research conducted by the inventor, however, has shown that nearly all electrical fire hazards will produce a variety of arcing patterns in a short period of time that will be detected by the present device, and reported as an alarm.

The visual and audible indicators are provided on the detector housing in addition to a "CLEAR" push-buttons, a "TEST" push-button, a range/sensitivity switch and a power-on indicator. The "CLEAR" push-button is provided to set the visual latch and the audible alarm to an OFF state, and the "TEST" push-button, when depressed, simulates a detected fire hazard to insure proper operation of the detector. The range/sensitivity switch is provided to select either an internal antenna for minimum sensitivity or the entire electrical system for maximum sensitivity. The range/sensitivity switch is useful for isolating the location of an electrical fire hazard. A standard, non-grounded, non-polarized power plug connects the device to the power distribution wiring in a residential, commercial or office establishment via a standard 120 V AC 60 Hz outlet, thereby using the entire distribution system as an antenna. This plug type permits full compatibility with older style receptacles.

The detector uses a low cost, compact, non-isolated transformerless AC to DC power supply, and because the detector does not require power line synchronization, it can also be provided DC power using a battery. When a battery is used, the detector can be removed from its mounting location and, through the use of a directional or omnidirectional type internal antenna, the detector can be used to isolate the location of the electrical fire hazard. The battery operated embodiment may maintain a connection to the power distribution system through the standard power plug and the 120 V AC 60 Hz outlet for RF reception only. For global power distribution systems various components of the detector are changed to accommodate different supply voltages and frequencies.

Accordingly, it is a principal object of the invention to provide an audible and visual indication of an electrical fire hazard.

It is another object of the invention to isolate the location of an electrical fire hazard.

It is a further object of the invention to provide an electrical fire hazard detector that can be used in AC power distribution systems with a multitude of different frequency and voltage parameters.

Still another object of the invention is to provide an electrical fire hazard detector that can be battery powered, and electrically isolated from the power distribution system being monitored.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
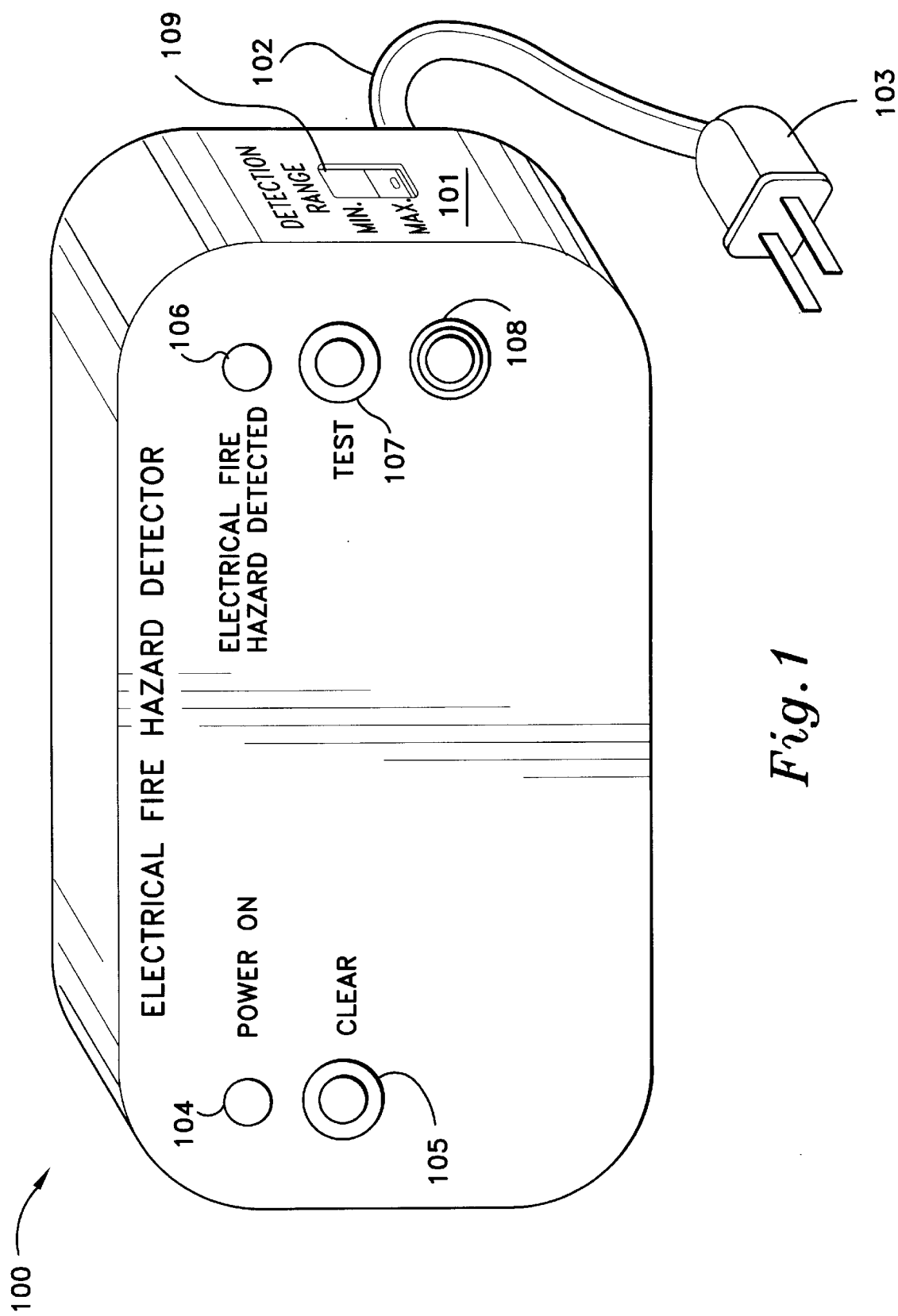
FIG. 1 is perspective view of the exterior of the electrical fire hazard detector of the present invention.

The electrical fire hazard detector 100 of the present invention is contained within an enclosure 101 as seen in FIG. 1. Although not shown, enclosure 101 includes means to attach the detector to a wall or similar structure in a convenient location. A power cord 102 connects the detector to an electrical distribution system via plug 103. The enclosure 101 has a number of external controls and indicators including: a power-on LED 104; a "CLEAR" push-button 105; an electrical fire hazard detected LED 106; a "TEST" push-button 107; an audible alarm 108; and a range/ sensitivity switch 109. In battery operated models, the cord 102 and plug 103 are unnecessary, but may be supplied for greater range (as explained in detail below).

Figure 2:
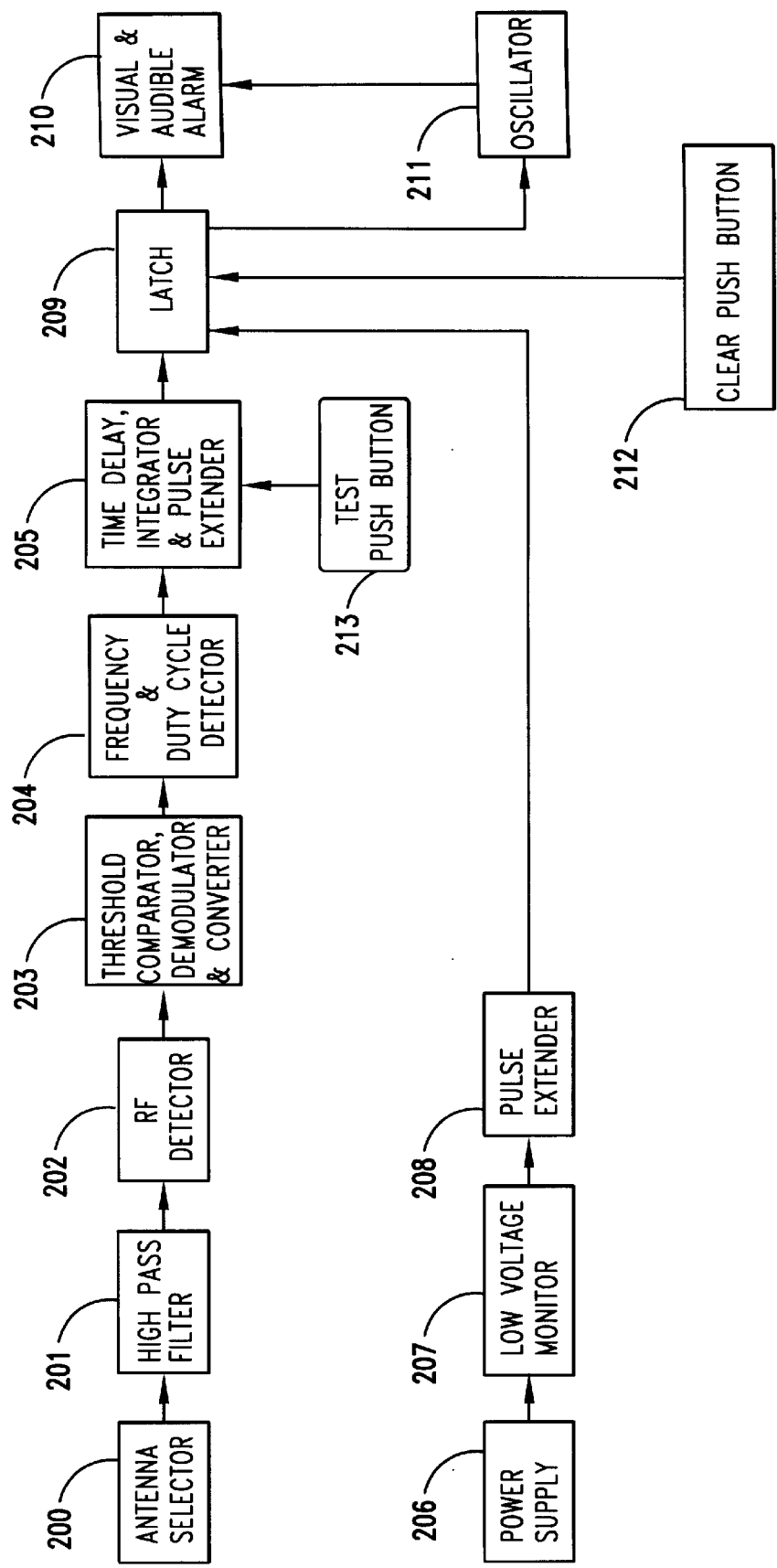
FIG. 2 is a block diagram of the electrical fire hazard detector.
Figure 3:
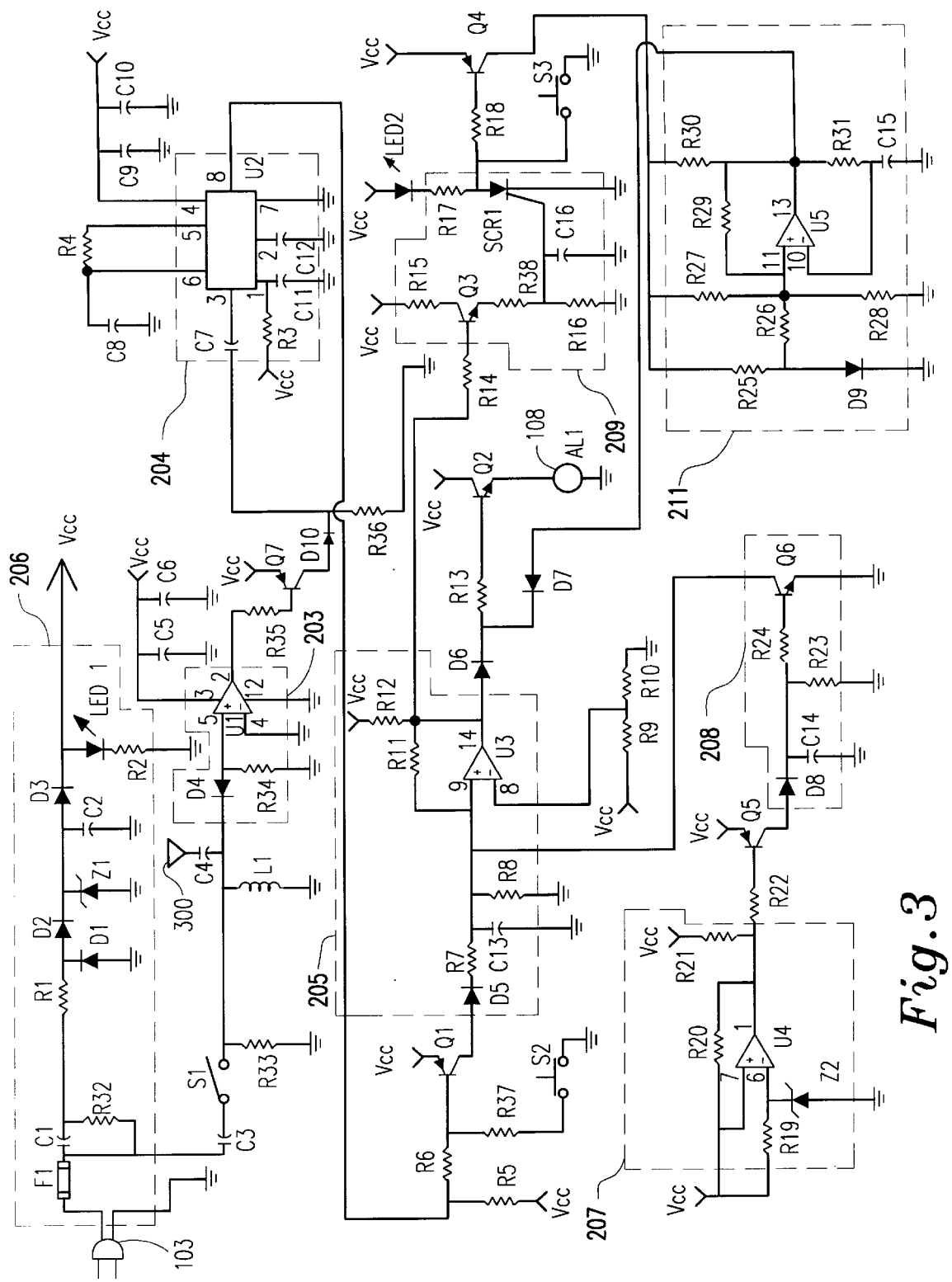
FIG. 3 is a detailed schematic diagram of the electrical fire hazard detector.

FIG. 2 is a block diagram of the various circuits used in the detector, while FIG. 3 shows the details of the detector's entire electronic circuit. Referring to FIG. 3, it should be noted that the electronic circuit of the present invention uses only two very low cost integrated circuits to perform comprehensive arcing fault detection. The plug 103 provides the AC input to the power supply 206 of the detector, and one side of the AC input is connected to circuit ground while the second side is routed to the circuit via fuse F1, which is a 250 VAC, 125 mA delayed fuse. Power supply 206 is a transformerless, non-isolated power supply which derives a low current DC voltage supply from a positive clamping circuit. A peak detector retains the peak voltage and a zener diode Z1 maintains the voltage at its reverse breakdown value (9.0 volts). On negative cycles of the AC input waveform, C1 charges through D1 to a value close to the negative peak value of the incoming voltage. The charging of C1 adds a DC voltage offset component to the incoming waveform voltage, and this results in nearly the entire waveform after C1 being above circuit ground potential. R32 (10 MΩ) is used to discharge the high voltage across C1 when power is disconnected from the unit. Only the positive components of the waveform pass through D2 into storage capacitor C2. The DC voltage is limited by Z1 to a predetermined DC level, preferably 9.0 Volts. R1 limits the inrush current of C1, while D3 ensures that only positive voltages reach the circuitry. The power supply 206 components include: C1 (250 VAC, 2.5 $\mu$F); R1 (22 Ω, 0.5 Watt); D1–D3 (silicon diodes); Z1 (9.0 Volt, 1.0 watt zener); C2, (1000 $\mu$F, 10 VDC); LED1, power "ON" green LED; and R2, 1 kΩ. In battery operated modules, D3, LED1 and R2 are the only above components needed, and if it is still desired to have the capability to monitor an entire power distribution system, the plug 103 and fuse F1 can be used to connect to C3 only.

The antenna selector 200 receives input from the power distribution system via plug 103, fuse F1, and capacitor C3 (250 V AC, 0.001 $\mu$F). S1 is used to select MAXIMUM or MINIMUM range and is formed as a single-pole single-throw (SPST) switch that connects or disconnects the power distribution system from the high-pass filter 201. When S1 is open (MINIMUM range), internal antenna 300 provides the input to the high-pass filter 201 Antenna 300 is a random length of wire, a wire loop style or preferably a ferrite loopstick high gain antenna. The wire loop and ferrite loopstick embodiments provide directional characteristics for isolating the location of the electrical fire hazard. The high-pass filter 201 is a single-pole high-pass filter circuit and includes L1 (100 $\mu$H) and C3 (0.001 $\mu$F). R33 (1 kΩ) provides impedance matching to both the internal and external antennas. This circuit results in a high-pass filter with a cutoff frequency of 500 kHz, although the cutoff frequency can be increased or decreased by changing L1 and/or C3 with little effect to overall performance. Optionally, a low Q bandpass filter could be used. Although a bandwidth between 100 kHz–10 MHz has been found to be effective, monitoring 0.5 MHz and up is optimum for detecting low level arcing in AC power electrical distribution systems. A practical limit of 100 MHz is realized due to power line physical characteristics. A channel/band selector switch and circuit may be needed for locations in close proximity to transmissions in the chosen RF frequency detection range.

A simple germanium signal type diode D4 is used as the passive RF detector 202. Only negative portions of the RF energy will pass through D4 to the threshold comparator 203 (U1 is one-fourth of a QUAD comparator integrated circuit, such as an LM339). R34 (10 kΩ) provides termination for the non-inverting input of the comparator. C5 (3.3 $\mu$F) and C6 (0.1 $\mu$F) are used as decoupling capacitors to assure that power at the integrated circuit is sufficient and free of noise, respectively. Other biased detector techniques that may be used for greater sensitivity include active detectors and/or lower offset voltage, higher gain comparators. Without the presence of RF energy, the output of the comparator will remain in the high state. Any voltages received at the non-inverting input of U1 that are below the reference point at the inverting input will cause the output of U1 to transition to low. To improve sensitivity, no hysteresis has been added to comparator U1, thereby allowing U1 to operate as a very high gain, open loop, saturated only amplifier. The comparator does not normally operate in the linear range, and therefore input voltage levels are not discriminated against. This method of non-discriminatory, non-linear amplification is a key point to the high performance and low cost of the present invention. The response time and inherent hysteresis of the comparator perform an amplitude demodulating function. Additional demodulating characteristics can be realized by adding capacitance either at the non-inverting input of the comparator or in parallel with R36.

The output from the threshold comparator 203 is connected to the input of the inverting circuit Q7 (2N3906), R35

(1 kΩ), R36 (10 kΩ) and D10, which provides an inverting function from the output of U1. C7 provides a DC isolated connection to the frequency detector input. Frequency detector 204 is comprised of U2 which is an LM567, Phase-Locked Loop circuit with high accuracy and quick lock-on speed (less than 500 ms). The frequency detector is tuned to a specific frequency (120 Hz in this embodiment) by C8 (1 $\mu$F) and R4 (8.3 kΩ). C11 (22 $\mu$F) and C12 (10 $\mu$F) determine the lock-on speed and bandwidth, respectively, which in the present embodiment is set for a 110–130 Hz response. R3 (56 kΩ) is used to decrease the sensitivity of the LM567. The output of the frequency detector 204 goes low when the output of the threshold comparator 203 contains a frequency component within the selected bandwidth range. 60 Hz frequency components will also trigger the frequency detector. This phenomenon is due to sub-harmonics of the fundamental frequency. Although less sensitive, an even sub-harmonic frequency will trigger due to non-half-wave symmetry in the input signal. Odd-harmonic properties will not be exhibited, again, because of the non-symmetrical behavior of the input waveform. R5 (1 kΩ) is a pull-up resistor, while C9 (3.3 $\mu$F) and C10 (0.1 $\mu$F) are used as decoupling capacitors to assure that power at the integrated circuit is sufficient and free of noise, respectively. The LM567 is very efficient at detecting the target frequency inclusive of the complex waveform, thereby identifying true arcing conditions even when they occur simultaneously with noisy RF sources.

Noisy RF received by the detector from sources such as variable speed drills, hair dryers, lamp dimmers and carrier current communications systems, are easily rejected as true hazards because these sources produce either: non-repetitive and asynchronous RF signatures at the monitored RF frequencies; and/or low level RF transmissions during an entire cycle of the AC power waveform, or high duty cycle noise (90% and above) or low duty cycle noise (20% and below) that is synchronous to the power waveform. This information can easily be ignored or lost by other arcing detectors especially at long distances from the source. The detector identifies as an electrical fire hazard, those RF signatures that are synchronous to the AC power waveform and fall within the range of frequencies monitored (preferably 110–130 Hz) and within the range of duty cycles (preferably 20–90%).

The output of the frequency detector 204 is connected to a time delay, integrator and pulse extender 205. When the output of U2 goes low, Q1 (2N3906) turns on through R6 (1 kΩ), causing C13 to charge at a rate defined by R7 (10 kΩ), C13 (4.7 $\mu$F) and R8 (500 kΩ). This charge rate determines the period of time for which the output of U2 must go low before an electrical fire hazard is "detected" (preferably less than one second). C13 and R8 perform the pulse extending function as C13 discharges through R8. It should be noted that D5 ensures C13 will not discharge through Q1. R7, C13 and R8 also act as an integrator so that concurrent shorter (i.e. of a duration less than one second) detection pulses can be identified as hazards. U3 transitions to a high output when C13 charges to a level that is above the reference voltage set by R9 (1 MΩ) and R10 (1 MΩ). R11 (10 MΩ) adds a small amount of positive feedback to add hysteresis and prevent oscillations, while R12 (4.7 KΩ) is the pull-up resistor for the open collector output of U3. A test circuit includes S2, operated by "TEST" push-button 107 which grounds the base of Q1 through R37 (10 kΩ), thus turning on Q1 when the "TEST" push-button is depressed.

The output of the time delay, integrator and pulse extender 205 is connected to the latching circuit 209 as well as the audible alarm (part of visual and audible alarm 210). When the output of U3 goes high, Q3 (2N3904), is turned on through R14 (100 kΩ). When Q3 conducts, a voltage drop occurs across R16 (500 kΩ) and C16 (3.3 $\mu$F), which triggers SCR1 to a latched-on state. R16, C16 and R38 (100 kΩ) form a low-pass filter so that spurious high frequency noise cannot trigger the SCR. Once SCR1 is latched on, self-flashing LED2, through R17 (1 kΩ) and the audible alarm oscillator 211 are activated. SCR1 will continue to conduct until being reset by providing a ground which bypasses current flow through the SCR, either by depressing the "CLEAR" push-button 105 which operates momentarily closed switch S3 (generally denoted as 212 in FIG. 2), or by the voltage monitor and power on reset circuit 207, as discussed below.

As long as SCR1 conducts, Q4 (2N2906) is turned on through R18 (10 Ω) thus enabling the oscillator 211. Once the oscillator 211 is enabled, the output of U5 will transition to the high state for one second every ten seconds. R31 (10 MΩ) and C15 (1 $\mu$F) set the frequency of oscillation, while R25 (1 MΩ), R26 (10 kΩ), R27 (100 kΩ), R28 (100 kΩ) and the voltage drop across D9 determine the duty cycle. R29 (100 kΩ) provides hysteresis, while R30 (4.7 kΩ) is a pull-up resistor. D6 and D7 form an OR gate, so that audible alarm 108 is activated by either U3 or U5, while the two comparators' outputs are isolated from each other. Q2 (2N3904) provides adequate current to audible alarm 108 when biased on through R13 (100 kΩ). Audible alarm 108 is a self-oscillating type alarm that beeps 2–3 times per second when supplied power by Q2.

A low voltage monitor and power-up reset circuit 207 provides a pulse to reset the detector during power-up and power glitches. During power-up the LM567 output is enabled. The non-inverting input to U4 is connected to $V_{cc}$, while R19 (1 kΩ) and 7.5 volt zener diode Z2 provide a reference voltage to the inverting input. A small amount of hysteresis is provided by R20 (10 MΩ). When the power supply voltage drops below the reference voltage, the output of U4 goes low, which turns on Q5 (2N3906) through R22 (1 kΩ). R21 (1 kΩ) is a pull-up resistor which turns off Q5 when the output of U4 is open. Once Q5 is turned on, C14 (47 $\mu$F) charges without delay through D8, and once the voltage on C14 reaches 0.6 volts or greater, Q6 (2N3904) turns on through R24 (56 kΩ). When Q6 turns on, a ground potential reset pulse is provided to discharge C13. R23 (100 kΩ) and R24 determine the rate at which C14 discharges, thus setting the reset pulse width. It should be noted that R24 does not effect this rate when the voltage on C14 is 0.6 volts or less. D8 prevents discharge of C14 through Q5.

The circuitry in the device can be replaced in part or whole with either a single package, low cost application-specific-integrated-circuit (ASIC) or a microcomputer.

It is to be understood that the present invention is not limited to the sole embodiment described above, but encompasses any and all embodiments within the scope of the following claims.

I claim:

1. An electrical fire hazard monitoring device for detecting the presence of hazardous electrical arcing, said device comprising:

means for receiving an RF signal emanating from hazardous electrical arcing;

means for filtering the RF signal to allow only frequencies within a predetermined bandwidth and duty cycle output range;

detection means for demodulating and pulse converting the received RF signal;

frequency and duty cycle detection means to sense frequencies within said predetermined bandwidth and duty cycle range, said frequency and duty cycle detection means producing a hazard detected signal in response to sensing frequencies within said predetermined bandwidth and duty cycles range;

integrator means for sensing the presence of said hazard detected signal during a first predetermined period of time; and indicator means for providing an indication of said hazard detected signal being present for said first predetermined period of time.

2. The electrical fire hazard monitoring device according to claim 1, further comprising:

latch means for continuing said indication once said presence of said hazard detected signal has been present for said first predetermined period of time, after the presence of said hazard detected signal.

3. The electrical fire hazard monitoring device according to claim 2, including:

clearing means to reset said latch means thereby ending said indication, until the presence of said hazard detected signal is once again present for said first predetermined period of time.

4. The electrical fire hazard monitoring device according to claim 1, wherein:

said indication is a visual indication comprised of a self-flashing LED.

5. The electrical fire hazard monitoring device according to claim 1, wherein:

said indication is an audible indication including a self-oscillating alarm.

6. The electrical fire hazard monitoring device according to claim 5, further including actuation means for actuating said self-oscillating alarm, said actuation means comprises:

a timing oscillator activating said self-oscillating alarm for a second predetermined period of time and deactivating said self-oscillating alarm for a third predetermined period of time.

7. The electrical fire hazard monitoring device according to claim 1, including:

testing means for activating said integrator means to thereby test said electrical fire hazard monitoring device.

8. The electrical fire hazard monitoring device according to claim 1, including:

power supply means for providing a DC voltage to components of said device.

9. The electrical fire hazard monitoring device according to claim 8, wherein:

said power supply means is a non-isolated transformerless power supply that derives said DC voltage from an AC source.

10. The electrical fire hazard monitoring device according to claim 8, wherein:

said power supply means is a battery.

11. The electrical fire hazard monitoring device according to claim 1, wherein:

said means for receiving an RF signal includes an electrical connection to a power distribution system, said hazardous electrical arcing being monitored in said power distribution system.

12. The electrical fire hazard monitoring device according to claim 1, wherein:

said means for receiving an RF signal includes an internal antenna.

13. The electrical fire hazard monitoring device according to claim 12, wherein:

said antenna is selected from the group consisting essentially of a directional and an omnidirectional type antenna for isolating the location of said hazardous electrical arcing.

14. The electrical fire hazard monitoring device according to claim 1, wherein:

said means for receiving an RF signal includes a switch with an electrical connection to a power distribution system and an internal antenna, said hazardous electrical arcing being directly monitored in said power distribution system and being indirectly monitored by receiving said RF signal via said antenna when said switch is closed, and being only indirectly monitored by receiving said RF signal via said antenna when said switch is open.

15. A method for detecting the presence of hazardous electrical arcing, said method comprising:

receiving an RF signal emanating from hazardous electrical arcing;

filtering the RF signal to allow only frequencies within a predetermined bandwidth and duty cycle range to pass therefrom;

demodulating and pulse converting the RF signal;

sensing frequencies within the predetermined bandwidth and duty cycle and producing a hazard detected signal in response to the frequencies within the predetermined bandwidth and duty cycles within a predetermined range;

sensing that the hazard detected signal has been present for a first predetermined period of time; and providing an indication of the hazard detected signal being present for the first predetermined period of time.

16. The method according to claim 15, further including:

continuing the indication once the presence of the hazard detected signal exists for the first predetermined period of time.

17. The method according to claim 16, further including:

manually resetting the indication to inhibit the indication until the presence of the hazard detected signal is once again present for the first predetermined period of time.

18. An electrical hazard indicating device for detecting hazardous electrical arcing comprising:

an RF receiver for receiving RF radiation generated by electrical arcing;

a circuit coupled to said RP receiver including a first integrated circuit for detecting frequency and duty cycle components of the RF radiation, and a second integrated circuit for determining when said frequency and duty cycle components fall within a predetermined range; and alarm means coupled to said circuit for indicating the presence of hazardous electrical arcing.

19. The electrical hazard indicating device according to claim 18, said first integrated circuit being a phase-locked-loop frequency detector, and said second integrated circuit being a QUAD comparator having four comparators.

20. The electrical hazard indicating device according to claim 19, wherein each said first and second integrated circuits being a single package application specific integrated circuit.

* * * * *